(12) United States Patent (10) Patent No.: US 8,947,929 B1
Yang (45) Date of Patent: Feb. 3, 2015

(54) FLASH-BASED SOFT INFORMATION GENERATION

(75) Inventor: Xueshi Yang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 118 days.

(21) Appl. No.: 13/538,771

(22) Filed: Jun. 29, 2012

Related U.S. Application Data

(63) Continuation-in-part of application No. 12/610,106, filed on Oct. 30, 2009, now Pat. No. 8,213,228.

(60) Provisional application No. 61/112,068, filed on Nov. 6, 2008.

(51) Int. Cl.
| | | |
|---|---|---|
| G11C 7/10 | (2006.01) | |
| G11C 7/00 | (2006.01) | |
| G11C 8/00 | (2006.01) | |
| G11C 16/26 | (2006.01) | |
| G11C 29/42 | (2006.01) | |
| G11C 7/14 | (2006.01) | |
| G11C 11/4096 | (2006.01) | |
| G11C 11/56 | (2006.01) | |
| G11C 16/28 | (2006.01) | |

(52) U.S. Cl.
CPC ...... *G11C 7/10* (2013.01); *G11C 16/26* (2013.01); *G11C 11/4096* (2013.01); *G11C 11/5642* (2013.01); *G11C 29/42* (2013.01); *G11C 16/28* (2013.01)
USPC ............ 365/185.03; 365/185.09; 365/185.33; 365/189.17

(58) Field of Classification Search
CPC ...... G11C 7/10; G11C 11/4096; G11C 16/26; G11C 11/5642; G11C 29/42; G11C 16/28
USPC ................ 365/185.03, 185.09, 185.2, 189.17
See application file for complete search history.

(56) References Cited

U.S. PATENT DOCUMENTS

| | | | |
|---|---|---|---|
| 5,864,504 | A | 1/1999 | Tanzawa et al. |
| 6,016,273 | A | 1/2000 | Seki et al. |
| 6,886,120 | B2 | 4/2005 | Yamazaki |
| 7,075,827 | B2 | 7/2006 | Aoyama et al. |
| 7,274,611 | B2 | 9/2007 | Roohparvar |
| 7,313,019 | B2 | 12/2007 | Giduturi et al. |
| 7,411,830 | B2 | 8/2008 | Takeuchi et al. |
| 7,463,528 | B2 | 12/2008 | Mokhlesi et al. |
| 7,467,253 | B2 | 12/2008 | Yero |
| 7,542,350 | B2 | 6/2009 | Park et al. |

(Continued)

OTHER PUBLICATIONS

"Non-Final Office Action", U.S. Appl. No. 13/177,965, Jul. 2, 2013, 7 pages.

(Continued)

*Primary Examiner* — Ly D Pham

(57) ABSTRACT

The present disclosure describes techniques for flash-based soft information generation. In some aspects a flash-memory device includes a soft information generator configured to determine soft information for a data value stored by a flash-memory cell. The soft information includes fewer bits than a number of data bits read from the flash-memory cell from which the soft information is generated. When the flash-memory device transfers the soft information to a memory controller, fewer bits per data value are transferred. By so doing, an efficiency of a data link between the flash memory device and the memory controller may be improved.

20 Claims, 11 Drawing Sheets

(56) References Cited

U.S. PATENT DOCUMENTS

| | | | |
|---|---|---|---|
| 7,599,221 B2 | 10/2009 | Yamada | |
| 7,613,045 B2 | 11/2009 | Murin et al. | |
| 7,903,462 B1 | 3/2011 | Yeung et al. | |
| 7,941,590 B2 | 5/2011 | Yang et al. | |
| 8,154,919 B2 | 4/2012 | Lee et al. | |
| 8,213,228 B1 | 7/2012 | Yang | |
| 8,213,236 B1 | 7/2012 | Wu | |
| 8,611,151 B1 | 12/2013 | Yang | |
| 8,638,613 B1 | 1/2014 | Wu | |
| 8,756,394 B1 | 6/2014 | Warner | |
| 8,843,723 B1 | 9/2014 | Warner | |
| 2001/0003198 A1 | 6/2001 | Wu | |
| 2008/0094897 A1 | 4/2008 | Chung et al. | |
| 2008/0123420 A1* | 5/2008 | Brandman et al. | 365/185.09 |
| 2008/0175055 A1 | 7/2008 | Kim | |
| 2008/0256282 A1 | 10/2008 | Guo et al. | |
| 2009/0273975 A1 | 11/2009 | Sarin et al. | |
| 2009/0300260 A1 | 12/2009 | Woo et al. | |
| 2010/0027350 A1 | 2/2010 | Melik-Martirosian et al. | |
| 2011/0041040 A1* | 2/2011 | Su et al. | 714/773 |
| 2011/0214029 A1* | 9/2011 | Steiner et al. | 714/746 |
| 2011/0246859 A1* | 10/2011 | Haratsch et al. | 714/773 |
| 2011/0305082 A1* | 12/2011 | Haratsch et al. | 365/185.03 |
| 2013/0047052 A1* | 2/2013 | Jakab et al. | 714/755 |
| 2013/0080862 A1* | 3/2013 | Bennett | 714/782 |

OTHER PUBLICATIONS

"Notice of Allowance", U.S. Appl. No. 13/268,183, Jul. 29, 2013, 5 pages.

"Notice of Allowance", U.S. Appl. No. 13/538,827, Sep. 17, 2013, 7 pages.

"Non-Final Office Action", U.S. Appl. No. 13/538,827, May 2, 2013, 6 pages.

"Non-Final Office Action", U.S. Appl. No. 13/268,183, May 7, 2013, 6 pages.

"Non-Final Office Action", U.S. Appl. No. 13/538,827, Feb. 22, 2013, 7 pages.

"Corrected Notice of Allowance", U.S. Appl. No. 13/268,183, Nov. 19, 2013, 2 pages.

"Notice of Allowance", U.S. Appl. No. 13/177,965, Nov. 20, 2013, 5 pages.

"Notice of Allowance", U.S. Appl. No. 12/610,106, (Feb. 29, 2012), 11 pages.

"Notice of Allowance", U.S. Appl. No. 12/762,150, (Mar. 19, 2012), 6 pages.

"Restriction Requirement", U.S. Appl. No. 12/610,106, (Dec. 7, 2011), 5 pages.

"Non-Final Office Action", U.S. Appl. No. 14/199,307, Apr. 10, 2014, 5 pages.

"Notice of Allowance", U.S. Appl. No. 14/199,307, May 7, 2014, 7 pages.

* cited by examiner

FLASH-BASED SOFT INFORMATION GENERATION

RELATED APPLICATIONS

This present disclosure is a continuation in part of, and claims priority to, U.S. application Ser. No. 12/610,106, filed Oct. 30, 2009, incorporated herein by reference in its entirety, which claims priority from and incorporates by reference U.S. Provisional Patent Application Ser. No. 61/112,068 filed Nov. 6, 2008, the disclosure of which is incorporated by reference herein in its entirety.

BACKGROUND

The background description provided herein is for the purpose of generally presenting the context of the disclosure. Unless otherwise indicated herein, the approaches described in this section are not prior art to the claims in the present disclosure and are not admitted to be prior art by inclusion in this section.

Data of electronic and computing devices is often written to non-volatile memory devices for storage. These memory storage devices typically include non-volatile memory media, such as flash-memory, for storing the data and a memory controller for writing the data to, or reading the data from, the non-volatile memory media. Flash-memory stores data as an electrical charge on a floating gate of a transistor configured as a flash-memory cell. Thus, to write data to a flash-memory cell, a particular level of electrical charge is applied to the floating gate that represents a value of the data. The electrical charge applied, however, may be distributed proximate, but not at this particular level, due to variances in the write process or electrical characteristics of the memory media.

A flash-memory cell is read by sensing electrical characteristics of the flash-memory cell. These electrical characteristics are affected by the level of electrical charge on the floating gate. Data bits representing the data value stored by the flash-memory cell can be determined, when a reference voltage is applied, based on whether the cell conducts. Once read, the data bits are then transferred to the memory controller for aggregation, error-correction, and subsequent transfer to a host device.

During the read process, multiple reads of the flash-memory cells may be performed to obtain an accurate measurement of a charge level stored by a flash cell due to the afore-mentioned distribution of electrical charge applied to the floating gates of the cells. Reading each cell multiple times enables various forms of error-correction, which increases reliability of the data read from the flash-memory. Multiple reads of the flash-memory cells, however, produce additional data bits that are transferred to the memory controller for error-correction. Transfer of these additional data bits increases a load, or an amount of data traffic, on a data link between the flash-memory and the memory controller. The increased load on the data link may result in reduced throughput for the data link and impaired read performance of the flash-memory device.

SUMMARY

This summary is provided to introduce subject matter that is further described below in the Detailed Description and Drawings. Accordingly, this Summary should not be considered to describe essential features nor used to limit the scope of the claimed subject matter.

A flash-memory device is described that includes an array of flash-memory cells, each of the flash-memory cells configured to store a data value, a soft information generator configured to determine, based on multiple reads of one of the flash-memory cells, soft information for the data value stored by the flash-memory cell, and a communication interface configured to transfer the soft information for the data value to a memory controller for iterative decoding of the data value.

A data storage device is described that includes a flash-memory integrated circuit (IC) having an array of flash-memory cells, each of the flash-memory cells configured to store a data value, a soft information generator configured to determine, based on data bits produced by multiple reads of one of the flash-memory cells, soft information for the data value stored by the flash-memory cell, and a controller interface configured to transfer, via a data bus, the soft information for the data value from the flash-memory IC for decoding. The data storage device also includes a flash-memory controller IC having a flash-memory interface configured to receive the soft information for the data value via the data bus, an error-correcting code (ECC) decoder configured to decode, based on the soft information, the data value of the flash-memory cell to provide error-corrected data, and a host interface configured to transfer the error-corrected data of the data storage device to a host device.

A method is described for reading, from a flash-memory cell of a flash-memory integrated circuit IC, a data bit representing a data value stored by the flash-memory cell, determining, within the flash-memory IC, soft information for the data value based on the data bit read from the flash-memory cell and at least another data bit previously read from the flash-memory cell, and transferring, from the flash-memory IC and via a data link, the soft information for the data value to a flash-memory controller IC for iterative decoding of the data value.

BRIEF DESCRIPTION OF THE DRAWINGS

The details of one or more implementations are set forth in the accompanying figures and the detailed description below. In the figures, the left-most digit of a reference number identifies the figure in which the reference number first appears. The use of the same reference numbers in different instances in the description and the figures indicate like elements.

DETAILED DESCRIPTION

Conventional techniques for reading flash-memory are directed towards error correction code (ECC) decoders that typically receive hard decisions for input (e.g., Bose, Chaudhuri, and Hocquenghem (BCH) ECC codes). In the context of these conventional techniques, bits representing the hard decision data are transferred from a NAND memory device to a memory controller for decoding. More-robust error correction codes based on soft information, however, are able to extend the life expectancy or improve data reliability of flash-memory. These soft information-based error correction codes include a variety of codes, such as Low-Density Parity-Codes (LDPC) codes, Turbo codes, Trellis Coded Modulation Codes, and the like. The soft information on which these codes are based is obtained by reading flash-memory cells multiple times. After each read, data bits (e.g., hard decision data bits) generated by the multiple reads are transferred from a NAND device to a memory controller, where the data bits are accumulated and converted to soft information. This soft information is then provided to an ECC decoder of the memory controller for error correction.

Transferring these data bits, however, increases an amount of data traffic on the data link between the flash-memory device and the memory controller. This increase in data traffic reduces throughput of the data link, which can impair read-performance of a flash-memory-based storage device. This disclosure describes techniques for flash based soft information generation. Soft information for a data value stored by a flash-memory cell is determined within a flash-memory device. This soft information for the data value generated and/or stored in the flash-memory device contains fewer bits than the data bits from which the soft information is derived. The soft information is then transferred, in lieu of the data bits, via the data link to the memory controller for error-correction operations. By so doing, fewer bits per data value are transferred via the data link, which can improve an efficiency of the data link and increase read-performance of the flash-memory-based storage device.

The following discussion describes an operating environment, techniques that may be employed in the operating environment, and an example flash-memory-based storage device in which components of the operating environment can be embodied. In the discussion below, reference is made to the operating environment by way of example only.

Operating Environment

Figure 1:
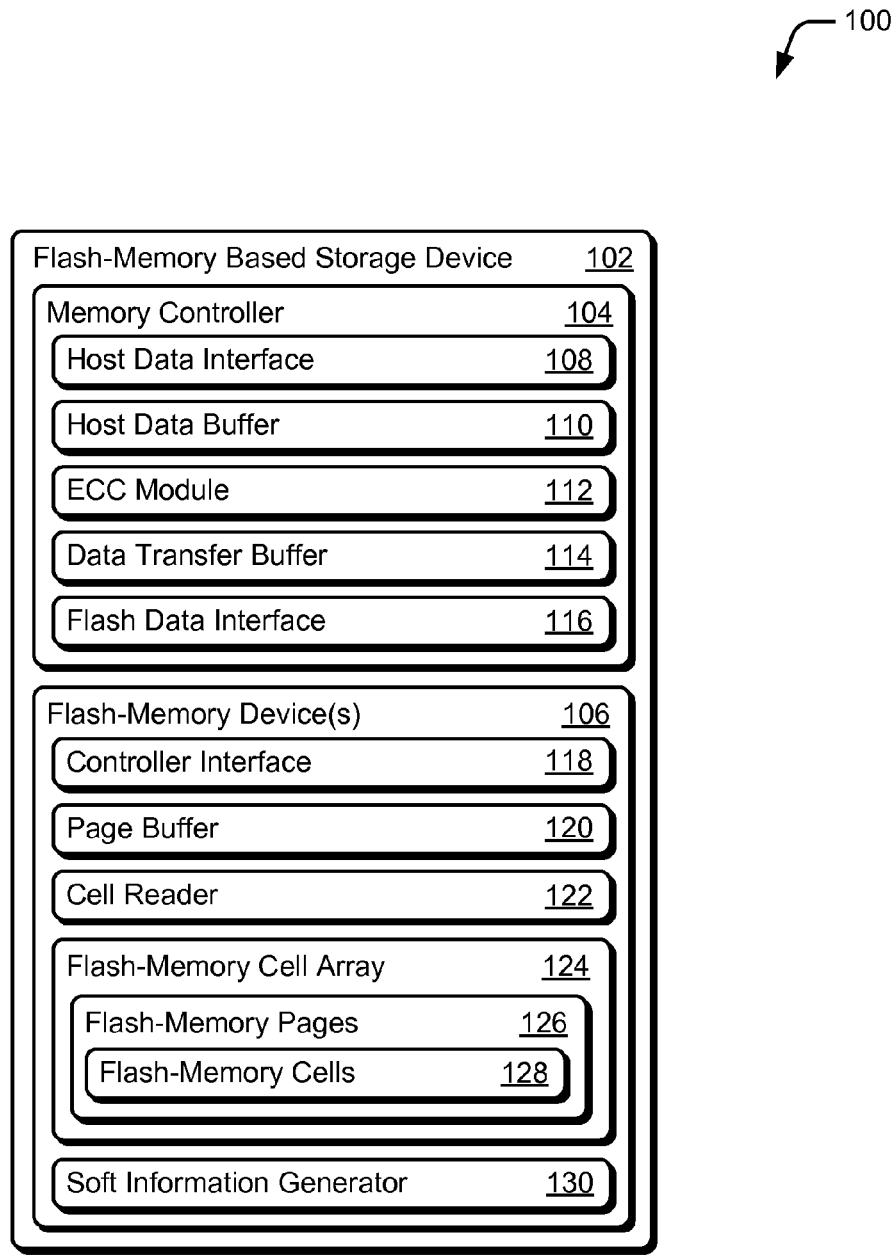
FIG. 1 illustrates an example operating environment having a flash-memory storage device in accordance with one or more aspects.

FIG. 1 illustrates an example operating environment 100 having a flash-memory-based storage device 102 (storage device 102). Storage device 102 includes memory controller 104 and flash-memory device(s) 106. Storage device 102 may include a single flash-memory device 106 embodied as an integrated circuit (IC), module, or chip. Alternately, storage device 102 may include multiple flash-memory devices configured as an array of ICs, modules, or chips. Storage device 102 may be embodied as any suitable type of data storage device, such as a solid-state drive (SSD), universal serial bus (USB) flash drive, flash-memory card/stick, secure digital input output (SDIO) card, peripheral component interconnect express (PCI-express) memory module, or as an integrated flash-memory module of an electronic or computing device.

Memory controller 104 controls the operation of and data communications for flash-memory device 106. Memory controller 104 includes host data interface 108, host data buffer 110, and error-correction code module 112 (ECC module 112). Host data interface 108 communicates commands or data with a host device, such as a computing device operably coupled with storage device 102. Host data interface 108 may communicate data in accordance with any suitable communication protocol, such as USB, Serial Advanced Technology Attachment (SATA), PCI-express, Secure Digital Input Output (SDIO), and the like. Host data buffer 110 stores data received from a host device or data to be communicated to the host device via host data interface 108. ECC module 112 provides coding functionalities for memory controller 104. For example, ECC module 112 may encode data for storage in flash-memory device 106 or decode data read from flash-memory device 106. ECC module 112 may implement, or be embodied as, a variety of coders and/or decoders, such as an ECC decoder, soft information decoder, iterative decoder, or low-density parity-check decoder.

Memory controller 104 also includes data transfer buffer 114 and flash data interface 116. Data transfer buffer 114 stores data to be written to, or read from, flash-memory device 106. Data transfer buffer 114 may be implemented with any suitable type of memory, such as random-access memory (RAM), static RAM (SRAM), fast RAM, dynamic RAM (DRAM), synchronous DRAM, and the like. Commands or data of memory controller 104 are transferred to and from flash-memory devices 106 via flash data interface 116. Flash data interface 116 may communicate in accordance with any suitable protocol, such as an Open NAND Flash Interface (ONFI) specification or a Toggle mode communication protocol.

Flash-memory device 106 includes memory controller interface 118 (controller interface 118), page buffer 120, cell reader 122, and flash-memory cell array 124. Controller interface 118, in conjunction with flash data interface 116, provides a data link (not shown) between memory controller 104 and flash-memory device 106. This data link permits data to be transferred between these two entities during read and write operations. The data link may operate in accordance with any suitable communication protocol, such as an ONFI specification or Toggle mode communication protocol.

Page buffer 120 stores data during read and write operations of flash-memory device 106. Page buffer 120 may be implemented with any suitable type of memory such as random-access memory (RAM), static RAM (SRAM), fast RAM, dynamic RAM (DRAM), synchronous DRAM, and the like. Page buffer 120 receives data bits from cell reader 122 during read operations of flash-memory device 106. Cell reader 122 may read data from flash-memory cell array 124 by various techniques for reading flash-memory examples of which are described below in greater detail.

Cells of flash-memory cell array 124 may be configured or structured in any suitable fashion. In this particular example, flash-memory cell array 124 includes flash-memory pages 126 of flash-memory cells 128. Flash-memory cells 128 may be configured as having single or multiple levels. Each flash-memory cell 128 of flash-memory cell array 124 stores a data value as one or multiple bits of information. These bit(s) are stored as an amount of electrical charge effective to set a threshold voltage of the flash-memory cell 128.

Flash-memory device 106 also includes soft information generator 130. Soft information generator 130 is configured to generate soft information for data reads from flash-memory cell array 124. This soft information indicates a hard decision associated with determining a value stored in a flash-memory cell and reliability information about the hard decision. For example, soft information for a binary value may be represented as a signed number, the number's sign indicating a 1 or 0, and the number's magnitude indicating reliability information. Generally, soft information generator 130 receives or accesses data bits produced by multiple reads of a flash-memory cell 128. Based on these data bits, which are indicative of a data value stored by the flash-memory cell 128, soft information generator 130 generates soft information for the data value. This is but one example implementation of soft information generator 130, additional implementations and uses of soft information generator 130 are described in greater detail below.

Generally, these entities of storage device 102 operate to read and provide data to a host device. By way of example, assume that memory controller 104 receives a request from a host device to retrieve data stored on storage device 102. Responsive to this request, memory controller 104 initiates a read operation for the data that is stored on flash-memory device 106. Cell reader 122 of flash-memory device 106 then fills page buffer 120 with data bits read from flash-memory pages 126. Soft information generator 130 then, based at least in part on the data bits stored in the page buffer, generates soft information for the data. During the generation of the soft information, the soft information (or intermediate values thereof) may be stored back to page buffer 120 or a separate memory within flash-memory device 106 that is configured to store soft information (not shown). This soft information is then transferred from flash-memory device 106 to data transfer buffer 114 of memory controller 104 via the data link between flash data interface 116 and controller interface 118. ECC module 112 then iteratively decodes the soft information to provide error-corrected data to host data buffer 110, which can then be accessed by the host device through host data interface 108. This error-corrected data may be corrected to any level suitable for use by a host device, such as up to 100% correct or as error-free data.

As another example, consider a read operation in the context of cell reader 122 accessing information of flash-memory cell array 124. During the read operation, cell reader 122 may access an entire flash-memory page 126 to determine threshold voltages for flash-memory cells 128. Data bits representing the determined threshold voltages are then transferred to page buffer 120. Assume here that flash-memory cell array 124 has one or more flash-memory pages 126, each comprising of 16,384 flash-memory cells 128. Page buffer 120 is sufficient to store read results from these cells, having a two kilo-byte (KB) capacity to store the data bits read from these cells simultaneously. Here, all 16,384 flash-memory cells 128 are read in parallel by cell reader 122. To do so, cell reader 122 applies reference voltages to flash-memory cells 128, thereby approximately determining a threshold voltage for each cell. Data bits representing the read threshold voltages for all 16,384 flash-memory cells 128 are then transferred to page buffer 120. Soft-information generator 130, after each read operation, accesses these data bits stored in page buffer 120 to determine soft information for the data stored by flash-memory cell array 124. Soft information generator 130 then updates or writes the soft information to a memory configured to store soft information, such as a memory integral with soft information generator 130 or another memory within flash-memory device 106 accessible by soft information generator 130. Once the soft information is generated for the data stored by flash-memory cell array 124, the soft information is transferred from flash-memory device 106 to memory controller 104 for decoding. It should be noted that, in the context of this and some other examples presented within the present disclosure, soft information is generated within a flash-memory device (e.g., a NAND device) rather than in a memory controller.

Example techniques for reading flash-memory cells 128, some of which are implemented using entities of environment 100, are set forth below in greater detail. Note that one or more of the entities (e.g., memory controller 104, flash-memory device 106, data transfer buffer 114, and page buffer 120) shown in FIG. 1 may be further divided, combined, and so on. These entities illustrate some of the many possible configurations of a flash-memory device (alone or combined) that are capable of employing techniques described herein.

Example Flash-Memory Cell

Figure 2:
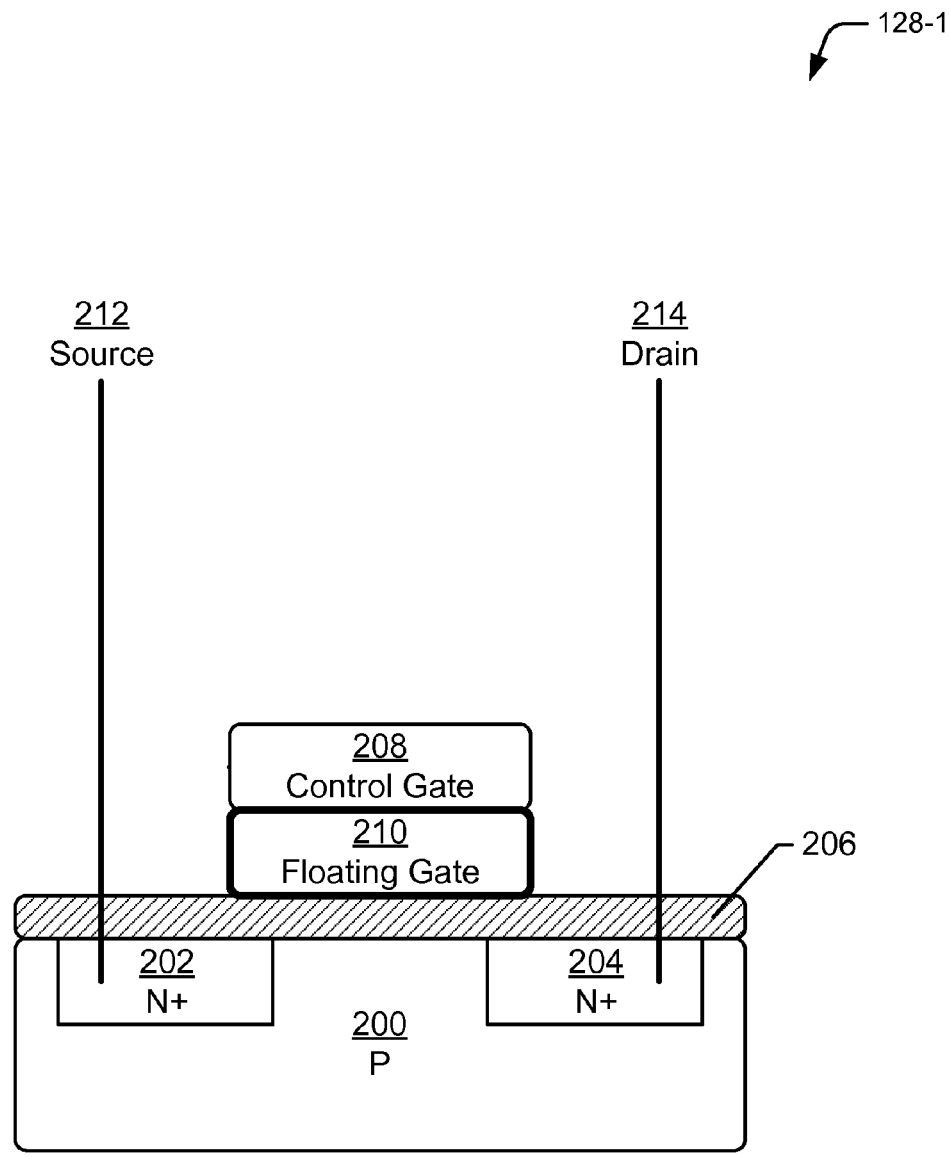
FIG. 2 illustrates an example of a single flash-memory cell in accordance with one or more aspects.

FIG. 2 illustrates an example of a single flash-memory cell 128-1. Flash-memory cell 128-1 is similar to a standard metal-oxide-silicon field-effect transistor (MOSFET). The MOSFET type shown is an N-channel MOSFET in that body 200 is a "P" region and source region 202 and drain region 204 are "N+" regions. A layer of insulating silicon dioxide 206 ($SiO_2$ 206) insulates control gate 208 and floating gate 210 from body 200. A standard MOSFET does not have floating gate 210. In a standard MOSFET, when a voltage is applied to control gate 208 that is higher than a fixed threshold voltage, an electric field is created. This electric field causes electrons from source region 202 supplied by source line 212 to flow into body 200 where it interfaces with $SiO_2$ 206. This creates an N-channel (not shown) between source region 202 and drain region 204. Current can pass through the N-channel between source line 212 and drain line 214.

A flash-memory cell 128-1 differs from a standard MOSFET in that it has floating gate 210. Floating gate 210 is oriented between control gate 208 and $SiO_2$ 206. Floating gate 210 is insulated by a layer of $SiO_2$ all around it (illustrated by the darker border). This allows a charge to be stored in floating gate 210 and remain there for extended periods (e.g., years). This charge partially cancels the electric field from control gate 208, which in turn modifies the threshold voltage of the flash-memory cell 128-1. By varying the amount or level of charge stored in floating gate 210, the threshold voltage of the cell can be varied.

When storing a data value in a flash-memory cell 128-1, the threshold voltage is set for the cell to a pre-determined amount associated with a particular data value (e.g., bit or bits of data). The threshold voltage is set by placing a charge in floating gate 210. When reading a flash-memory cell 128-1, a reference voltage is applied to control gate 208. Current flowing between source line 212 and drain line 214 is detected (or its absence detected). By detecting this current, it is known whether or not the reference voltage applied to control gate 208 is higher or lower than the threshold voltage. By so doing, it can be determined approximately at which level the threshold voltage is at, which in turn determines what data value (e.g., bit or bits) are stored in flash-memory cell 128-1.

Figure 3:
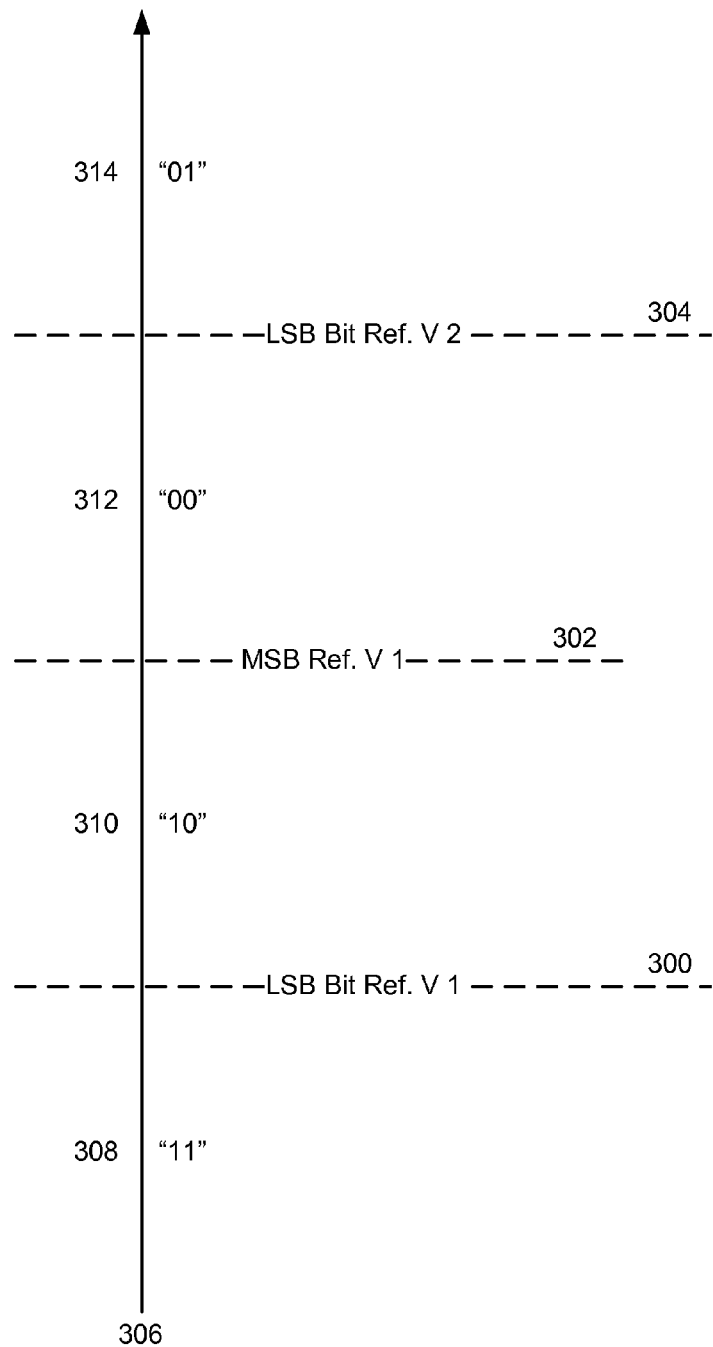
FIG. 3 illustrates reference voltages of a two-level MLC flash-memory cell in accordance with one or more aspects.

FIG. 3 illustrates the reference voltages of a two-bits/cell multi-level-cell (MLC) flash-memory cell. A two-bits/cell flash cell stores two bits of data and uses three different reference voltages (300, 302, and 304) to read those bits. The variable threshold voltage of flash-memory cell 128-1 is illustrated by arrowed line 306. For simplicity assume that a minimum threshold voltage is 1 volt and a maximum threshold voltage is 2 volts (at the bottom and top of the page, respectively). Reference voltage 300 is approximately 1.25 volts, reference voltage 302 is approximately 1.5 volts, and reference voltage 304 is approximately 1.75 volts. When data is stored in the cell, the threshold voltage will be set to one of four threshold voltages. For two bits of data, there are four data regions 308, 310, 312, and 314. Data region 308 is represented by threshold voltages from 1 volt to just under 1.25 volts but is typically set at approximately 1.125 volts. Data region 310 is represented by threshold voltages from 1.25 volts to just under 1.5 volts but is typically set at approximately 1.375 volts. Data region 312 is represented by threshold voltages from 1.5 volts to just under 1.75 volts but is typically set at approximately 1.625 volts. Data region 314 is represented by threshold voltages from 1.75 volts to 2 volts but is typically set at approximately 1.875 volts.

In conventional two-level flash-memory cells, a read operation consists of applying one of the three reference voltages (300, 302, and 304) to control gate 208. Whether or not current is flowing between source line 212 and drain line 214 is determined. If current is flowing because the applied reference voltage is higher than the set threshold voltage, then a 1 is output as a data bit, which is stored in a page buffer. This data bit, which indicates a read decision for the flash-memory cell, is a hard decision data bit. Alternately or additionally, the data bit output from a cell read operation may be referred to as a reference bit. In conventional methods of reading flash-memory this data bit is transferred from a flash memory device to a data transfer buffer for receipt by a memory controller. This process is repeated for the other two data bits. The memory controller then, via an internal soft information block, determines soft information for a data value stored by a flash-memory cell based on the data bits (e.g., hard decision data bits) received from the flash-memory device. Using this soft information generated within the memory controller, an ECC module of the memory controller then determines a value stored in the cell. Thus, for one read operation, three data bits are determined by the flash-memory device and then transmitted to a memory controller having internal soft information block.

Techniques described herein reduce the number of data bits transmitted by transmitting soft information bits, which increases an efficiency of a data link between memory controller 104 and flash-memory device 106. This may result in increased data read speeds for storage device 102. In the example shown in FIG. 3, a particular order of association for two-bit soft information values (e.g. soft information bits) enables a reduction in the number of data transferred to memory controller 104. Soft information values indicate a hard decision associated with determining a value stored in a flash-memory cell and reliability information about the hard decision. For example, soft information for a binary value may be represented as a signed number, the number's sign indicating a 1 or 0, and the number's magnitude indicating reliability information. From this binary value, which indicates a hard decision and reliability information, a data value may be reliably decoded with an iterative decoder.

For the two-bit cell of FIG. 3, the soft information bits (SI bits) are assigned as follows: SI bits "11" are assigned to data region 308; "10" to data region 310; "00" to data region 312; and "01" to data region 314. The most-significant bit (MSB) is the $2^1$ place of the above two-bit data values. The least-significant bit (LSB) is the $2^0$ place of the above two-bit SI values. Notice that the most-significant bit (MSB) is divided into two main data-bit regions by reference voltage 302. For example, a most-significant bit of 1 is associated with data regions 308 and 310, which together make up a data-bit region for a most-significant bit of 1. A most-significant bit of 0 is associated with data regions 312 and 314, which together make up a data-bit region for a most-significant bit of 0. By associated it is meant that, in order to store a most-significant bit of 1 or 0, the threshold voltage of the cell is set to a threshold voltage within the associated data-bit region. This allows for the most-significant bit to be determined by applying a single reference voltage. Reference voltage 302 (MSB Ref. V 1) is applied and the resulting data bit of 1 or 0 is the SI bit for the most-significant bit of the data value stored in the cell. This SI bit is transferred to memory controller 104.

The least-significant bit (LSB) is divided into three main data-bit regions determined as follows. A least-significant bit of 1 is associated with data regions 308 and 314, each of which is a separate data bit region for a least-significant bit of 1. A least-significant bit of 0 is associated with data regions 310 and 312, which together make up a data bit region for a least-significant bit of 0. This allows for the least-significant bit to be determined by applying two reference voltages. Reference voltage 300 (LSB Ref V 1) is applied and the resulting data bit of 1 or 0 is stored in page buffer 120. Reference voltage 304 (LSB Bit Ref. V 2) is applied and the resulting data bit of 1 or 0 is subjected to an exclusive-OR (XOR) operation with the previous data bit residing in page buffer 120. The result is then inverted and stored in page buffer 120. This result of the XOR operation and inversion is the SI bit for the least-significant bit of the data value stored in the cell. This SI bit is transferred to memory controller 104. Alternatively an exclusive-NOR (XNOR) operation is performed on the data bits and no inversion is necessary. Thus, for one read operation, three data bits are determined, but only two SI bits are transmitted to memory controller 104.

This reduction in an amount of data transferred becomes even more important when more levels are added. For example, in three-bits/cell flash-memory, one read operation involves seven data bits being determined but only three SI bits being transmitted to memory controller 104. A simple formula shows the contrast between conventional flash-memory and these new techniques. In conventional techniques, $2^b-1$ bits of information are transferred, where b is the number of bits in the data value stored in the cell. Thus, with a three-level cell (b=3), conventional techniques transfer a number of bits=$2^3-1=7$. The techniques described herein enable as few as b bits of information to be transferred (b=3) to memory controller 104. Likewise, for a four-bits/cell flash cell, the number of data bits transferred using conventional techniques is =$2^4-1=15$. The techniques described herein permit as few as four SI bits to be transferred (b=4).

Example Flash-Memory Cell Enabling a Confidence Bit

Another issue with flash-memory cells 128 is that sometimes they are defective, such as when a charge stored in floating gate 210 dissipates unintentionally. This causes the threshold voltage of the cell to float, permitting one or more bits of the data value to change (e.g., flip). Consider FIG. 4, which illustrates reference voltages of a single-level-cell (SLC) flash-memory cell. An SLC flash-memory cell stores one bit of data as its data value. Thus, one reference voltage 400 is used to determine the cell's stored data value. In order to determine if a cell's threshold voltage is floating, however, additional data regions may be defined around reference voltage 400. These additional data regions include and/or are defined by threshold voltages at or above reference voltage 402 and below reference voltage 404. A single-level-cell is used as an example, though multi-level-cells may also be used.

Assume that the range of possible threshold voltages 406 has a minimum of 1 volt and a maximum of 2 volts. Reference voltage 400 is approximately 1.5 volts, reference voltage 402 is approximately 1.4 volts, and reference voltage 404 is approximately 1.6 volts. When data is stored in the flash-memory cell 128, the threshold voltage will be set to a threshold voltage within one of two data regions. A data bit of "1" is associated with a first data region, which includes regions 408 and 410. This first data region is represented by threshold voltages from 1 volt to just under 1.5 volts. Typically a data bit of "1" will be stored by setting the threshold voltage to approximately 1.25 volts. A data bit of "0" is associated with a second data region, which includes regions 412 and 414. This second data region is represented by threshold voltages from 1.5 volts to 2 volts. A data bit of "0" will typically be stored by setting a threshold voltage of approximately 1.75 volts. Additional data regions including regions 410 and 414 are represented by threshold voltages from 1.4 volts to just under 1.6 volts.

If the threshold voltage is within the additional data regions that include regions 410 and 414, the flash-memory cell 128 is more likely to be defective and its data value erroneous. To determine if the threshold voltage is within these additional regions, reference voltage 402 (MSB Ref. V 2) is applied and the resulting data bit of 1 or 0 is stored in page buffer 120. Reference voltage 404 (MSB Ref. V 3) is applied and the resulting data bit of 1 or 0 is subjected to an XOR operation with the previous data bit residing in page buffer 120. The resulting bit is stored in page buffer 120 as a confidence bit of soft information. A confidence bit of 1 indicates that the threshold voltage is within region 410 or region 414 for its associated data bit. In this case, there is only one confidence bit, but in some MLC memory there is a confidence bit for each bit of data value. This confidence bit is transferred to memory controller 104. Note that the result of the XOR operation is not inverted as when determining the least-significant bit for the two-level cell example. Thus, by using a similar technique, an extra confidence bit is added within the flash-memory device using two additional reference voltages but only one extra bit of information is transferred to the memory controller.

The confidence bit provides better read-out resolution and can be used efficiently by an appropriate error-correction code (ECC) decoder for improved error recovery. A hard decision bit (e.g., hard decision) and its corresponding confidence bit (e.g., reliability information) together make up a quantized value (e.g., soft information) that can be translated into a real value output or a log-likelihood ratio (LLR) value. The table below shows the possible real value or LLR value output for the four possible quantized values. The LLR value output is assuming a noise variance of $\sigma^2$. In other words, the LLR value models the uncertainty or deviation of the actual threshold voltage of a cell from its nominal threshold voltage by an additive Gaussian noise model. The variance of the Gaussian noise is given by $\sigma^2$.

TABLE I

| Hard Decision Bit | 1 | 1 | 0 | 0 |
|---|---|---|---|---|
| Confidence Bit | 0 | 1 | 1 | 0 |
| Real Value Output | −1 | −0.2 | 0.2 | 1 |
| LLR value output | $-2/\sigma^2$ | $-0.2/\sigma^2$ | $0.2/\sigma^2$ | $2/\sigma^2$ |

If more read-out resolution is desired, one or more additional data regions can be added. For example, adding one more reference voltage both above (at 416) and below (at 418) the regions in the example above (hereinafter the inner regions) will define outer regions. These outer regions include regions 420 and 422. Adding additional regions in turn will allow for confidence bits associated with different levels of confidence. If the threshold voltage is within one of these outer regions, the cell is more likely to be defective than if the threshold voltage is within the data regions (e.g., data regions 408 or 410). If the threshold voltage is within the outer regions but not within the inner regions, however, the cell is less likely to be defective than if the threshold voltage is within the inner regions. If the threshold voltage is within the inner regions, however, the cell is most likely to be defective.

Example Methods for Flash-Based Soft information Generation

The following discussion describes techniques for flash-based soft information generation, which reduce a number of bits transmitted to a memory controller. Reducing a number of bits transmitted to the memory controller can improve efficiency of a data link between a flash-memory device and a memory controller. By so doing, read performance of a flash-memory device may be improved. These techniques can be implemented using the previously described environments or entities, such as soft information generator 130 of FIG. 1 embodied on a flash-memory device 106. These techniques include methods illustrated in FIGS. 5, 6, 8, and 9, each of which is shown as a set of operations performed by one or more entities. These methods are not necessarily limited to the orders shown for performing the operations. Further, these methods may be used in conjunction with one another, in whole or in part, whether performed by the same entity, separate entities, or any combination thereof. Alternately or additionally, aspects of these methods may be implemented by any of the entities described herein, which may be configured as hardware, firmware, software, or a combination thereof. In portions of the following discussion, reference will be made to operating environment 100 of FIG. 1 and entities of FIGS. 2, 9, and 10 by way of example. Such reference is not to be taken as limited to operating environment 100 but rather as illustrative of one of a variety of examples.

Figure 5:
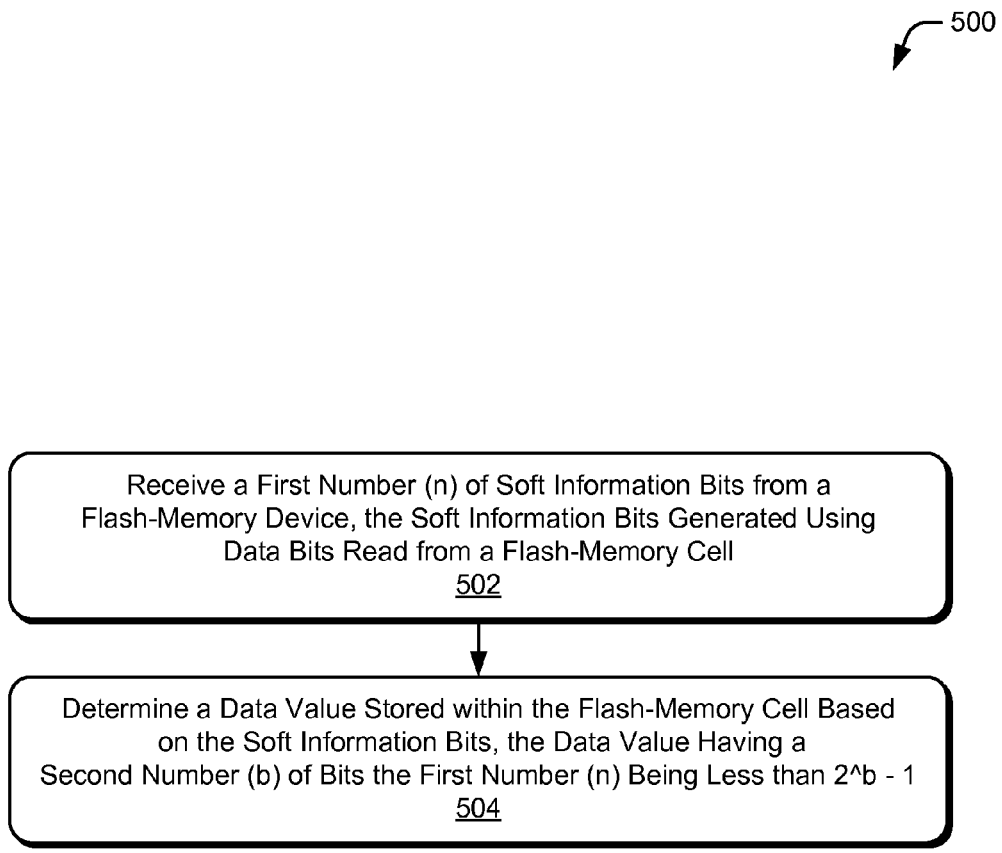
FIG. 5 illustrates a method of reading a data value stored in a flash-memory cell.

FIG. 5 illustrates a method 500 for reading a data value stored in a flash-memory cell. At 502, a first number (n) of soft information bits are received from a flash-memory device. The soft information bits were generated using data bits read from a flash-memory cell. At 504, a data value stored within the flash-memory cell is determined based on the soft information bits. The data value can be determined by an ECC decoder of a memory controller. This data value is comprised of a second number (b) of bits. The first number (n) of data bits communicated at 502 is less than $2^b-1$ bits. Data value associations are arranged to enable simple logic to determine a particular soft information bit (SI bit), such as without requiring transmission of each data bit to the memory controller. This allows for fewer bits to be transferred, increasing efficiency of a data link between a flash-memory device and a memory controller, which in turn improves read performance of flash-memory cells. For example, for a two-bits/cell MLC flash-memory cell less than three bits of soft information are transferred to memory controller 104. For a three-bits/cell MLC flash-memory cell less than seven bits of soft information are transferred to memory controller 104. For a four-bits/cell MLC flash-memory cell less than fifteen bits of soft information are transferred to memory controller 104. For an eight-bits/cell MLC flash-memory cell less than 255 bits of soft information are transferred to memory controller 104.

Figure 6:
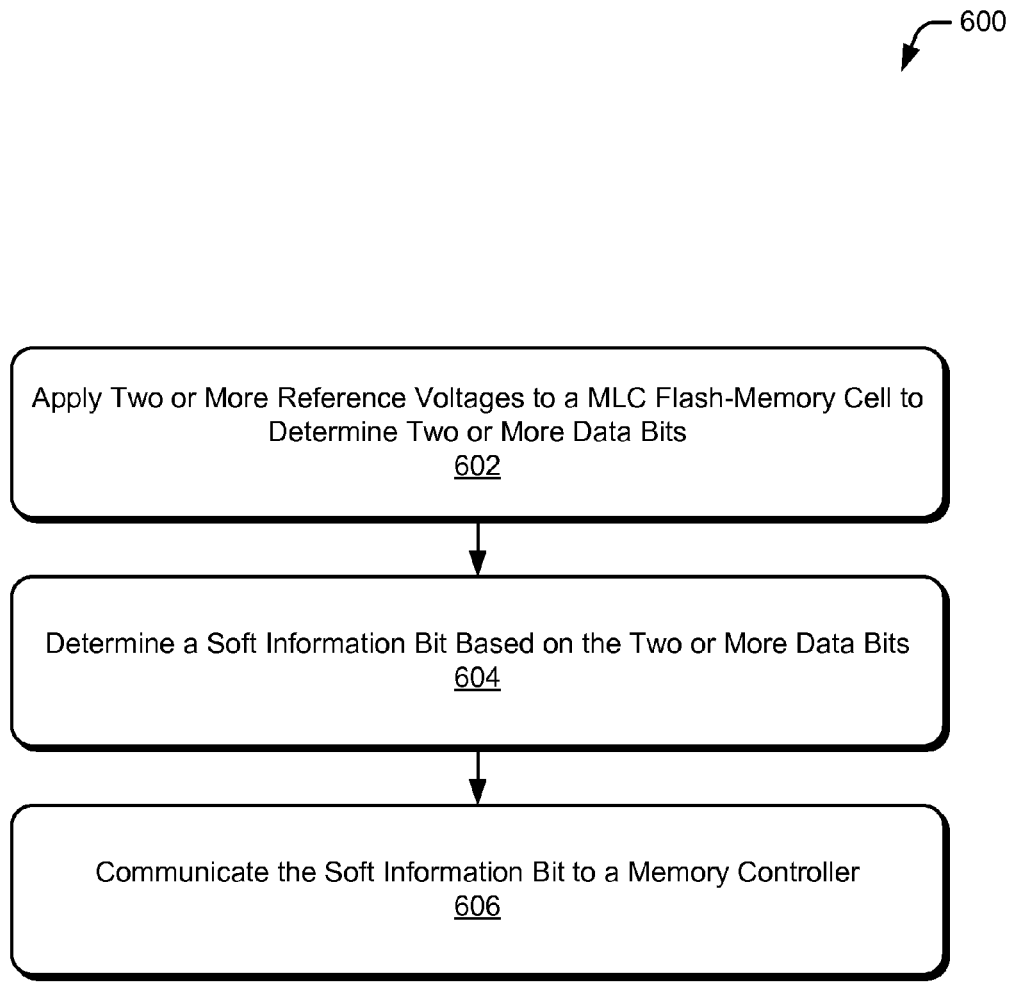
FIG. 6 illustrates a method of reading a data value stored in a flash-memory cell.

FIG. 6 illustrates a method 600 for reading a data value stored in a flash-memory cell. At 602, two or more reference voltages are applied to a multi-level cell to determine two or more data bits. At 604, a soft information bit (SI bit) is determined based on the two or more data bits. The SI bit may be any suitable bit, such as a hard decision bit or a bit representing reliability information (e.g., confidence bit). One way of determining the SI bit is to perform one or more XOR operations on the two or more data bits. The result of the one or more XOR operations is then inverted to create the SI bit. At 606, the SI bit is communicated to a flash controller.

Figure 7:
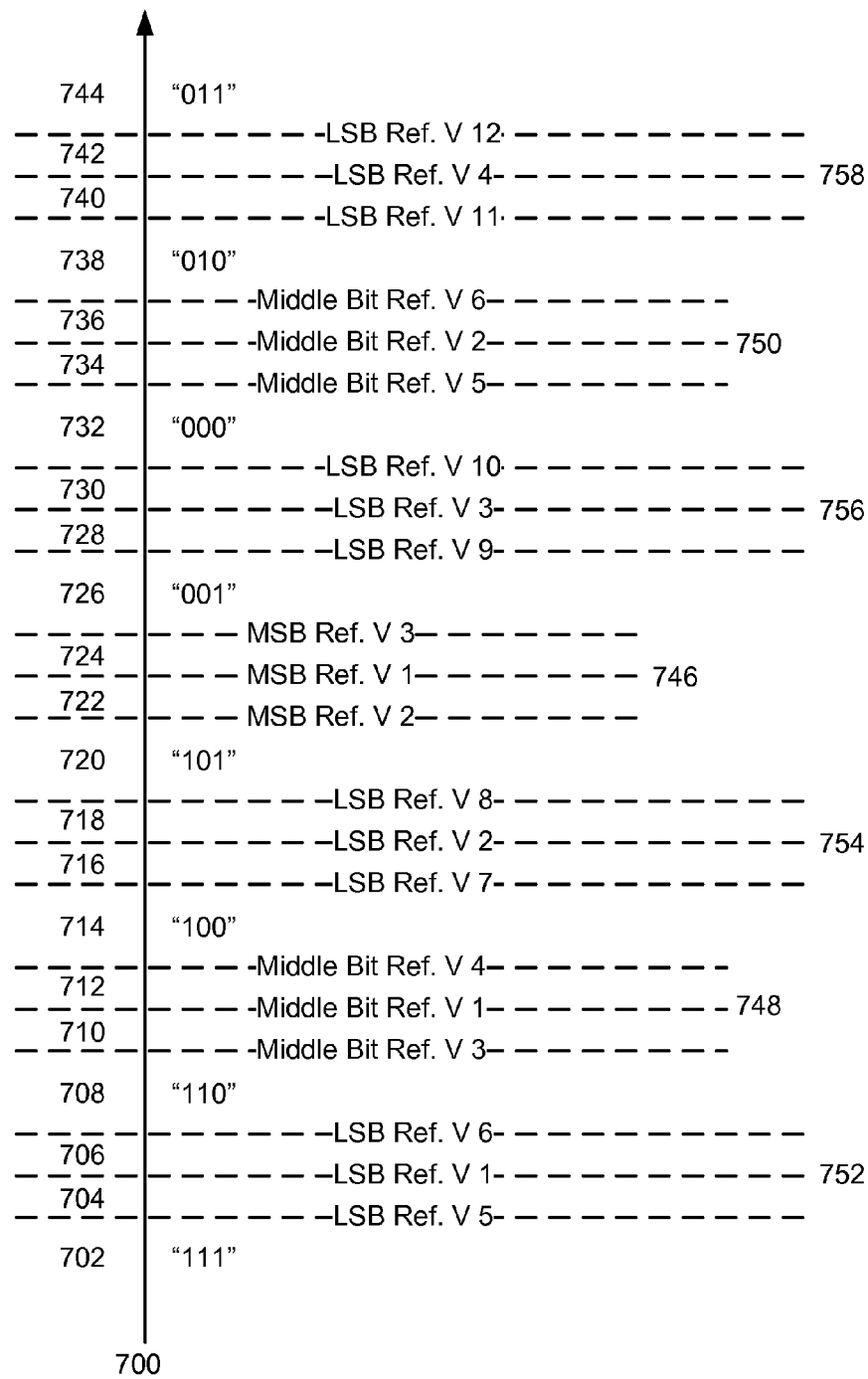
FIG. 7 illustrates reference voltages of a three-level MLC flash-memory cell in accordance with one or more aspects.

By way of example consider application of methods 500 and/or 600 to a three-bits/cell flash cell illustrated in FIG. 7. The range of possible threshold voltages is indicated by arrowed line 700. Regions 702-744 are defined by different reference voltages (Ref V). The binary values in quotes (e.g., "111", "110" . . . "011") represent data values possibly stored in the cell. A most-significant-bit ($2^2$ place) of 1 is associated with a data-bit region comprised of threshold voltages within regions 702-722. A most-significant bit of 0 is associated with a data-bit region comprised of threshold voltages within regions 724-744. Thus the most-significant bit of the data value stored in the cell is determined by applying reference voltage 746 (MSB Ref. V 1). The resulting data bit is placed in page buffer 120. For the most-significant bit, the data bit is the SI bit, which is transferred to data transfer buffer 114 for use by memory controller 104.

A middle bit ($2^1$ place) of 1 is associated with two data-bit regions. The first data-bit region associated with a middle bit of 1 is comprised of threshold voltages within regions 702-710. The second data-bit region associated with a middle bit of 1 is comprised of threshold voltages within regions 736-744. A middle bit of 0 is associated with a data-bit region comprised of threshold voltages within regions 712-734. To determine the middle bit of the data value stored in the cell, two reference voltages 748 and 750 (Middle Bit Ref. V 1 and 2) are applied as in 602 above. The resulting data bits are subjected to an XOR operation as in 604 above. The result of the XOR operation is inverted and the final result is placed in page buffer 120. This final result is the SI bit for the middle bit and is transferred to data transfer buffer 114 for use by memory controller 104 as in 606 above. Note that instead of an XOR operation an XNOR operation can be used (as well as other operations permitting a similar result). In this case, the result of the XNOR operation is not inverted as it is the SI bit.

A least-significant-bit ($2^0$ place) of 1 is associated with three data-bit regions. The first data-bit region associated with a least-significant bit of 1 is comprised of threshold voltages within regions 702 and 704. The second data-bit region associated with a least-significant bit of 1 is comprised of threshold voltages within regions 718-728. The third data-bit region associated with a least-significant bit of 1 is comprised of threshold voltages within regions 742 and 744. A least-significant bit of 0 is associated with two data-bit regions. The first data-bit region associated with a least-significant bit of 0 is comprised of threshold voltages within regions 706-716. The second data-bit region associated with a least-significant bit of 0 is comprised of threshold voltages within regions 730-740.

To determine the least-significant bit of the data value stored in the cell, four reference voltages 752, 754, 756, and 758 (LSB Ref. V 1-4) are applied as in 602 above. The resulting data bits are subjected to XOR operations as in 604 above. The result of the XOR operation is inverted and the final result is placed in page buffer 120. This final result is the SI bit for the least-significant bit and is transferred to data transfer buffer 114 for use by memory controller 104 as in 606 above. Note that instead of XOR operations XNOR operations can be used. In this case, the result of the XNOR operations is not inverted as it is the SI bit.

Figure 8:
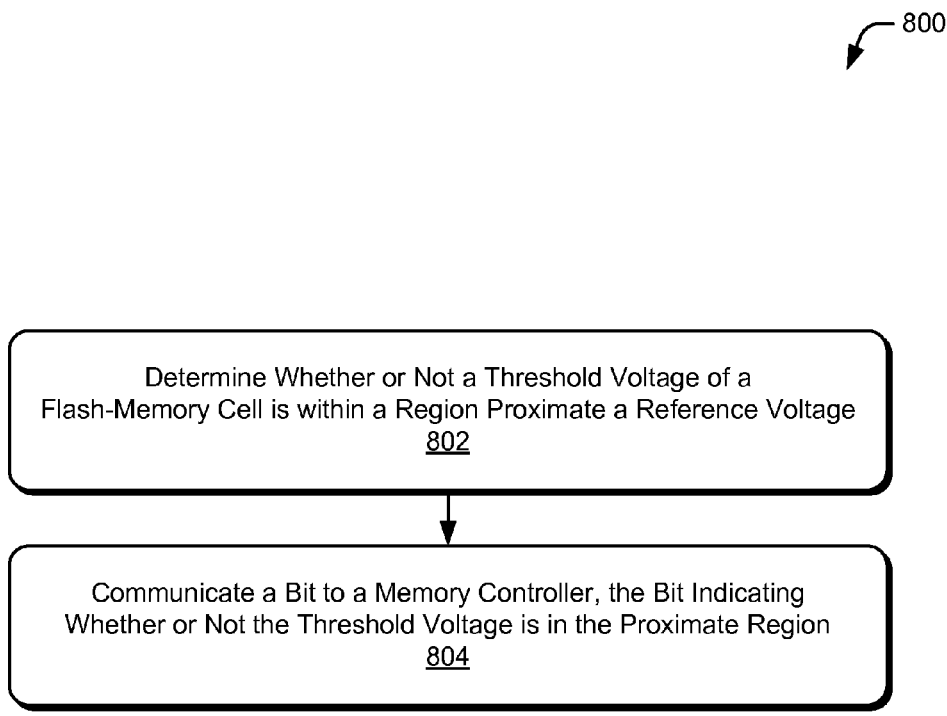
FIG. 8 illustrates a method of detecting whether a threshold voltage is proximate a border between two data-bit regions.

FIG. 8 illustrates a method 800 for improving error-correction of a cell by detecting whether the threshold voltage is in close proximity to a border between two data-bit regions. At 802, it is determined whether or not a threshold voltage of a flash-memory cell is within a region proximate a reference voltage that defines a border between two data-bit regions. This reference voltage, hereinafter the first reference voltage, has proximate regions associated with it. These regions are further defined by a second reference voltage and a third reference voltage. The second reference voltage is lower than the first reference voltage and the third reference voltage is higher than the first reference voltage. At 804, a soft information bit (SI) is communicated to a flash controller. The SI bit indicates whether or not the threshold voltage is in one of the proximate regions.

Figure 4:
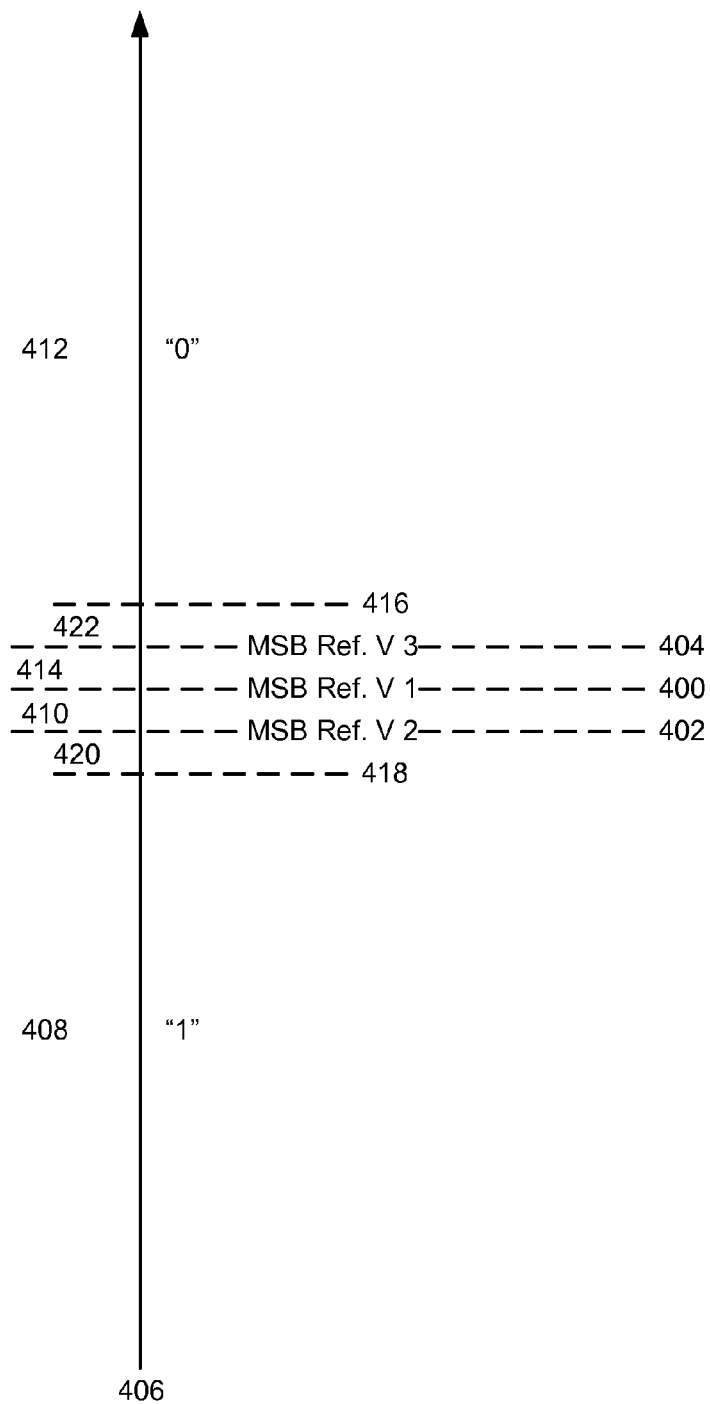
FIG. 4 illustrates reference voltages of a single-level-cell (SLC) flash-memory cell in accordance with one or more aspects.

Using the example of FIG. 4, reference voltage 402 is applied and the resulting data bit is stored. Reference voltage 404 is applied and the resulting data bit is subjected to an XOR operation with the stored bit to produce a SI bit (e.g., confidence bit). This SI bit is transferred to memory controller 104 as at 804 above.

For a more detailed example consider FIG. 7. For the most-significant bit (MSB) of the data value stored in the cell, two regions surrounding reference voltage 746 are defined. This is identical to how the confidence bit is determined in FIG. 4. The confidence bit indicates whether or not the threshold voltage of the cell is within these regions proximate the reference voltage. If the threshold voltage is within these proximate regions, there is a much higher probability that the threshold voltage has floated between the first (702-722) and second (724-744) data-bit regions associated with a most-significant bit of 1 or 0 respectively.

For the middle bit, there are two reference voltages (748 and 750), each of which defines two additional sets of regions. One set of proximate regions is comprised of threshold voltages in regions 710 and 712. The other set of proximate regions is comprised of threshold voltages in regions 734 and 736. To determine if the threshold voltage is within either set of proximate regions, four reference voltages are applied and the resulting data bits are subjected to XOR operations. The result of the XOR operations is the confidence bit, which indicates if the threshold voltage is within either of the two sets of proximate regions. If the threshold voltage is within either set of proximate regions, there is a much higher probability that the threshold voltage has floated between the three data-bit regions associated with the middle bit. The confidence bit is transferred to memory controller 104 as at 804 above.

For the least-significant-bit (LSB), there are four reference voltages (752, 754, 756, and 758), each of which further define an additional sets of proximate regions. These regions are proximate a border between two data-bit values and are useful to determine reliability information. One set of proximate regions is comprised of threshold voltages in regions 704 and 706, another set of proximate regions is comprised of threshold voltages in regions 716 and 718, another set of proximate regions is comprised of threshold voltages in regions 728 and 730, and another set of proximate regions is comprised of threshold voltages in regions 740 and 742. To determine if the threshold voltage is within any of these sets of proximate regions, eight reference voltages are applied and the resulting data bits are subjected to XOR operations. The result of the XOR operations is the SI bits (e.g., confidence bits), which indicates if the threshold voltage is within any of these sets of proximate regions. If the threshold voltage is within any of these sets of proximate regions, there is a much higher probability that the threshold voltage has floated between the five data-bit regions associated with the least-significant bit. The SI bit is transferred to memory controller 104 as at 804 above. If finer resolution of reading is desired, more regions can be added by inserting additional reference voltages; however, the operation principle is similar to the above description. Soft-error-correction decoders, such as those implemented in memory controllers, can effectively exploit the output of multiple sets of additional proximate regions to improve the error decoding performance.

Figure 9:
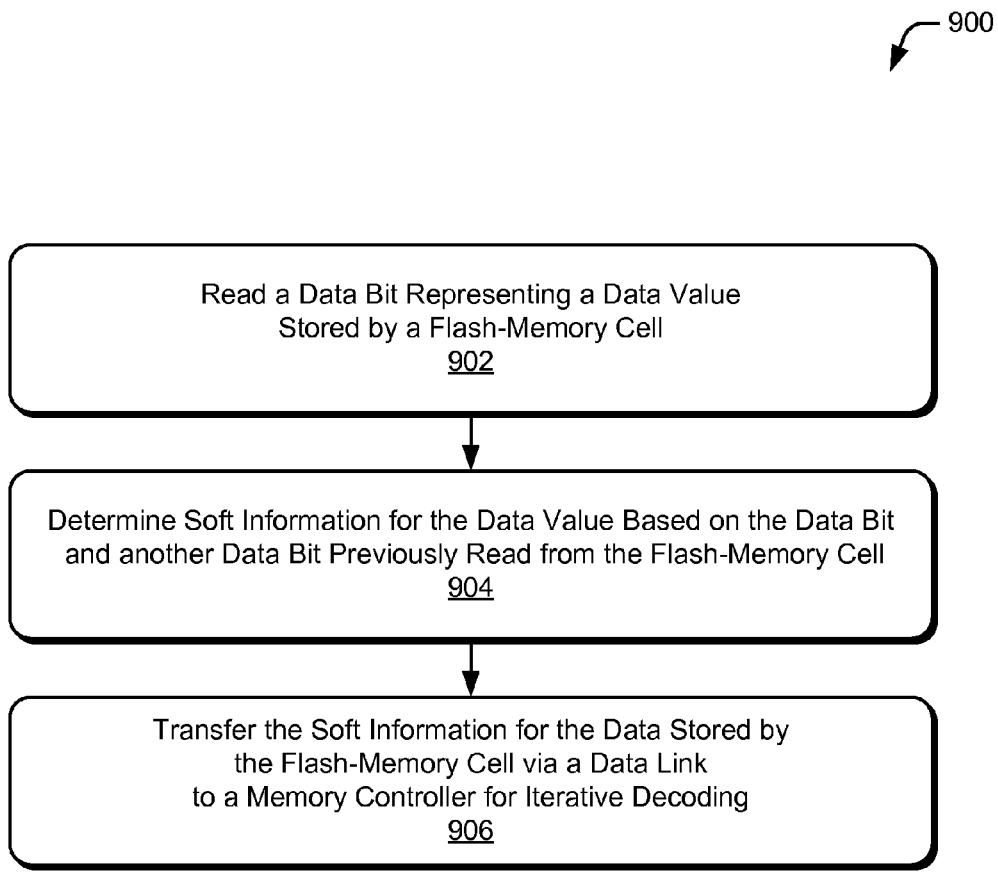
FIG. 9 illustrates a method of determining soft information for a data value stored by a flash-memory cell.

FIG. 9 illustrates a method 900 for determining soft information for a data value stored by a flash-memory cell. At 902, a data bit that represents a data value stored by a flash-memory cell is read. The data value stored by the flash-memory cell may be a single bit value (e.g., SLC flash-memory) or a multiple bit value (e.g., MLC flash-memory). The data bit may be read by applying a reference voltage to the flash-memory cell, such as described above. The data bit may be a hard decision data bit if produced from an initial read of the flash-memory cell. In other cases, the data bit may be useful to determine soft information for the value stored by the flash-memory cell if produced from subsequent read operations.

Figure 10:
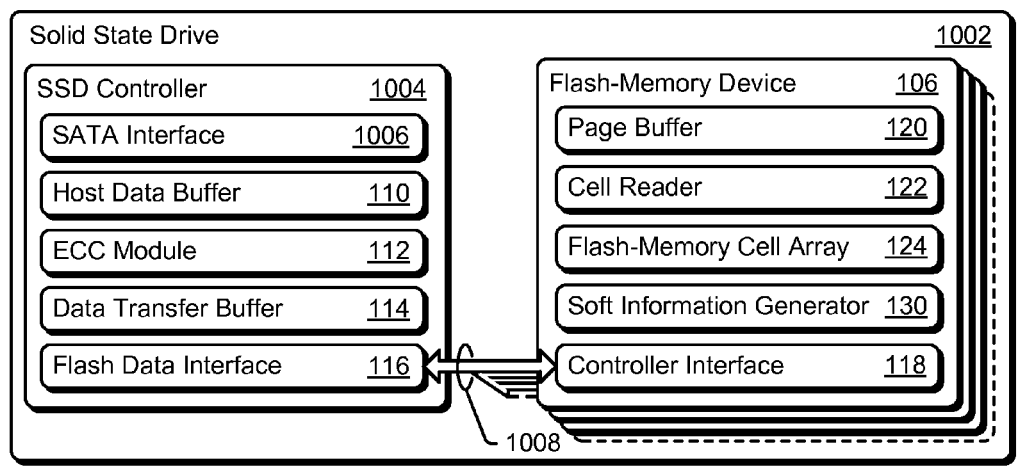
FIG. 10 illustrates an example solid state drive in accordance with one or more aspects.

As an example, consider method 900 in the context of FIG. 10, which illustrates an example solid state drive 1002 (SSD 1002) in accordance with one or more aspects. SSD 1002 includes a memory controller in the form of solid state drive controller 1004 (SSD controller 1004) and an array of flash-memory devices 106. SSD controller includes SATA interface 1006 for communicating with host devices in accordance to various SATA communication protocols. Other entities of SSD 1002, such as components of SSD controller 1004 and flash-memory device 106, are configured identically or similar to those of storage device 102 of FIG. 1.

SSD 1002 also includes data link 1008 over which SSD controller 1004 and flash-memory devices 106 communicate. Data link 1008 communicates via any suitable protocol, such as an ONFI standard or a Toggle mode communication protocol. As illustrated in FIG. 10, data link 1008 may provide interconnections to one or more flash-memory devices 106, which can enable SSD controller 1004 to access multiple flash-memory devices 106 in parallel.

Figure 11:
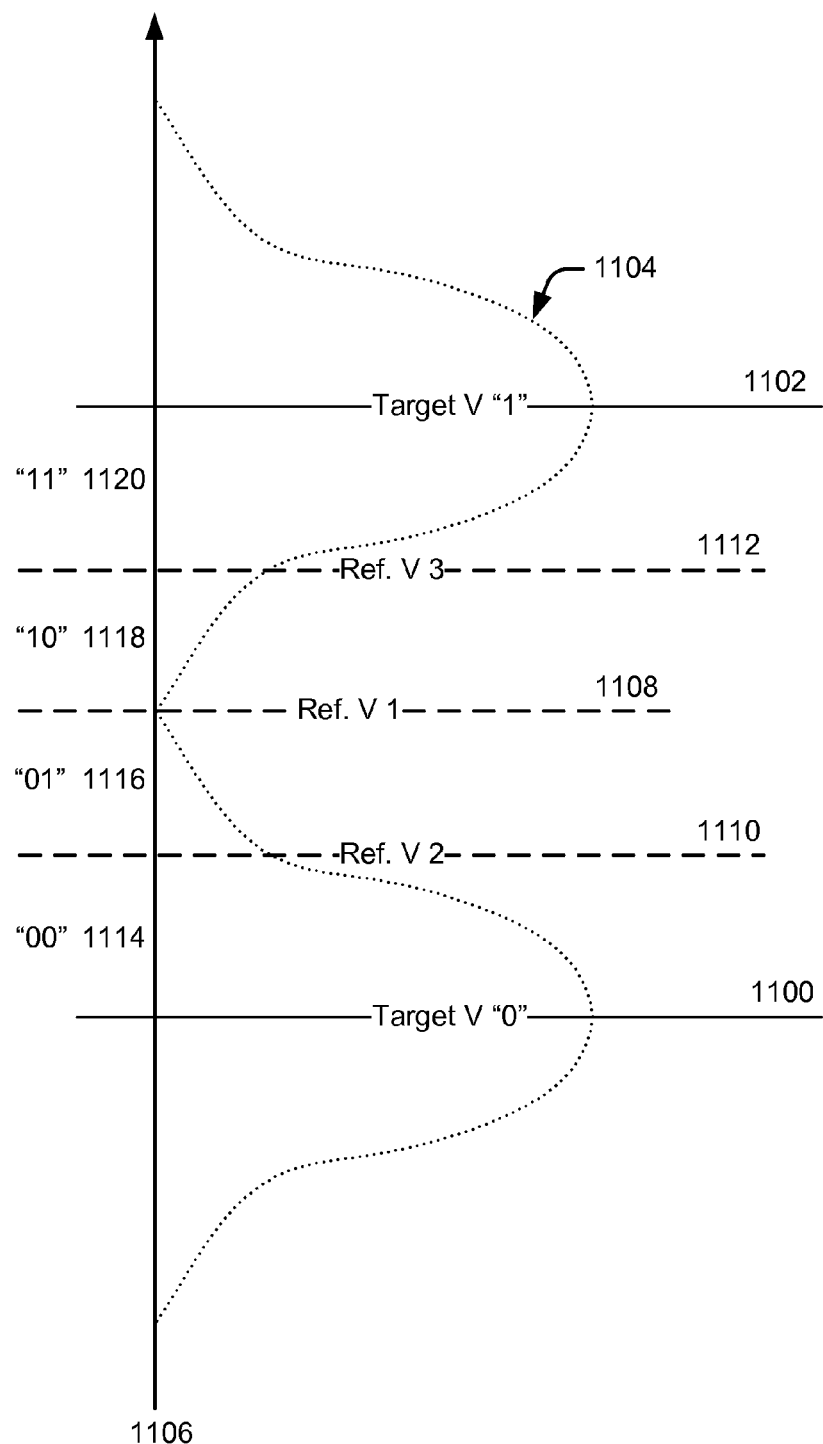
FIG. 11 illustrates another set of reference voltages of a SLC flash-memory cell in accordance with one or more aspects.

In the context of FIG. 10, assume that SSD 1002 is connected to a laptop computer. Here assume that a user of the laptop computer is attempting to play a music file (e.g., MP3 file) that is stored on SSD 1002. SSD controller 1004 initiates a read operation to retrieve data of the music file that is stored on flash-memory device 106. Assume that flash-memory cell array 124 is configured as SLC flash-memory, threshold voltages of which are illustrated in FIG. 11.

Flash-memory cell 128-1, in this particular example, is a single-bit/cell flash cell that stores a single bit of data value as one of two threshold voltage levels. When flash-memory cell 128-1 is programmed, a threshold voltage is charged to one of the two target threshold voltage levels depending on the value of the bit being stored.

These target threshold levels are illustrated as target threshold voltage "0" 1100 (Target V "0") and target threshold voltage "1" 1102 (Target V "0" 1102). Charging a threshold voltage to an exact threshold voltage, however, is not possible due to real-world limitations of the data write process and/or electrical characteristics of the flash-memory media.

This results in a distribution of threshold voltage around the target threshold voltages, which is illustrated by distribution curve 1104 along the variable threshold voltage of flash-memory cell 128-1 illustrated by arrowed line 1106. The threshold voltage of flash-memory cell 128-1 is read using three different reference voltages (1108, 1110, and 1112). These three reference voltages are applied sequentially to produce three data bits for reading data from flash-memory cell 128. Data regions 1114, 1116, 1118, and 1120 represent possible regions in which the threshold voltage of flash-memory cell 128-1 resides.

Initially, a hard decision data bit is determined by applying reference voltage 1108 to flash-memory cell 128-1 and reading a corresponding data bit. This operation produces a data bit of "0" if the threshold voltage is below reference voltage 1108 or a "1" if the threshold voltage is above reference voltage 1108. To obtain soft information, two additional reads are performed by applying reference voltages 1110 and 1112 (e.g., fractional reference voltages) to flash-memory cell 128-1. This is effective to partition threshold voltage 1106 into the four data regions.

The data bits of these two additional reads are then used to determine in which of these data regions the threshold voltage of flash-memory cell 128-1 resides. Reliabilities of the data value read from flash-memory cell 128-1 can be associated with each of the data regions. For instance, data regions 1114 and 1120 may indicate a data value of "0" or "1" with high reliability respectively. Data regions 1116 and 1118 may indicate a data value of "0" or "1" with low reliability respectively. It should be noted that, although three read operations were performed to determine the data region in which the threshold voltage resides, soft information indicating the region only includes two bits. These two bits of soft information can then be transmitted to a memory controller in lieu of the three data bits read from the flash-memory cell. Here the most significant bit corresponds to the hard decision and the least significant bit corresponds to the reliability of the hard decision (e.g., high or low).

Here, assume that data bits produced by applying reference voltages 1108 and 1110 have been previously stored in an internal memory buffer of soft information generator 130 (e.g., a "1" and "1" respectively). Here, cell reader 122 applies reference 1112 voltage to produce a third data bit (e.g. "0") for reading flash-memory cell 128-1.

At 904, soft information for the data value is determined based on the data bit read from the flash-memory cell. This soft information includes fewer bits than a number of data bits from which it is generated. The soft information is generated within a flash-memory device. The soft information may be determined using at least another data bit previously read from the flash-memory cell. For example, a soft information generator may receive the data bit read from the cell reader and access a data buffer storing a previously read data bit. Each data bit may be read from the flash memory cell using a different reference voltage. In some cases, the soft information generator may write the soft information to a data buffer, which may be internal or external to the soft information generator. In such cases, the soft information may be written to a location storing the previously read data bit to conserve space within the data buffer.

Continuing the ongoing example, soft information generator 130 receives the third data bit from cell reader 122. Soft information generator 130 then accesses its internal memory buffer to retrieve the first and the second data bits read from flash-memory cell 128. From these three data bits, soft information generator 130 then determines that the threshold voltage of flash-memory cell 128 is within region 1118, which has assigned soft information bits of "10." Soft information generator 130 then writes these two soft information bits to its internal memory buffer (within flash-memory device 106).

At 906, the soft information for the data value is transferred to a memory controller for iterative decoding via a data link. The soft information is transferred from a flash-memory device. The data link may be configured for any suitable communication, such as for ONFI compliant or Toggle mode communication. At operation 906, the data bits used to generate the soft information are not transmitted out of the flash-memory device. By transferring the soft information for the data value, rather than the data bits read from the flash-memory cell, a number of bits transmitted on the data link can be reduced. Reducing the number of bits transmitted via the data link can improve an efficiency of the data link and improve read performance of a flash-memory device.

Concluding the present example, the soft information for the data value stored by flash-memory cell 128 is transferred from the internal memory of soft information generator 130 to data transfer buffer 114 via data link 1008. EEC module 112 then performs iterative decoding (e.g., LDPC decoding) to provide an error-corrected bit of data. This bit of data value is then combined with other error-corrected bits of data in host data buffer 110 to reconstruct a block of data for the user's music file. The block of data can then be accessed by the user's laptop computer via SATA interface 1006.

One or more of the techniques described above can be performed by one or more programmable processors executing a computer program to perform functions by operating on input data and generating output. Generally, the techniques can take the form of an entirely hardware embodiment, an entirely software embodiment, or an embodiment containing both hardware and software components. In one implementation, the methods are implemented in software, which includes but is not limited to firmware, resident software, microcode, etc. Furthermore, the methods can take the form of a computer program product accessible from a computer-usable or computer-readable medium providing program code for use by or in connection with a computer or any instruction execution system.

For the purposes of this description, a computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W) and DVD.

Although the subject matter has been described in language specific to structural features and/or methodological techniques and/or acts, it is to be understood that the subject matter defined in the appended claims is not necessarily limited to the specific features, techniques, or acts described above, including orders in which they are performed.

What is claimed is:

1. A flash-memory device comprising:
   an array of flash-memory cells, each of the flash-memory cells configured to store a data value;
   a soft information generator configured to determine, based on multiple reads of one of the flash-memory cells, soft information for the data value stored by the one of the flash-memory cells, each of the multiple reads of the one of the flash-memory cells producing a respective data bit useful to determine the soft information for the data value; and
   a communication interface configured to transfer the soft information for the data value to a memory controller for iterative decoding of the data value and to not transfer at least some of the respective data bits to the memory controller.

2. The flash-memory device of claim 1, wherein each of the multiple reads is based on a respective reference voltage, each of the respective reference voltages being different.

3. The flash-memory device of claim 1, wherein the array of the flash-memory cells is an array of single-level-cell (SLC) flash-memory cells configured to store a single bit of data value per cell or an array multi-level-cell (MLC) flash-memory cells configured to store two of more bits of data value per cell.

4. The flash-memory device of claim 1, wherein the communication interface operates in compliance with an Open NAND Flash Interface (ONFI) specification or a Toggle mode communication protocol.

5. The flash-memory device of claim 1, wherein the flash-memory device includes a data buffer configured to store each of the data bits produced by one of the multiple reads of the flash-memory cell.

6. The flash-memory device of claim 5, wherein the soft information generator is further configured to determine the soft information based at least in part on one of the respective data bits stored in a particular location of the data buffer and write at least a portion of the soft information back to the particular location of the data buffer at which the respective data bit was stored.

7. The flash-memory device of claim 5, wherein the data buffer is composed of random-access memory (RAM).

8. A data storage device comprising:
   a flash-memory integrated circuit (IC) including:
      an array of flash-memory cells, each of the flash-memory cells configured to store a data value;
      a soft information generator configured to determine, based on data bits produced by multiple reads of one of the flash-memory cells, soft information for the data value stored by the one of the flash-memory cells; and
      a controller interface configured to transfer, via a data link, the soft information for the data value from the flash-memory IC for decoding; and
   a flash-memory controller IC including:
      a flash-memory interface configured to receive the soft information for the data value via the data link;
      an error-correcting code (ECC) decoder configured to decode, based on the soft information, the data value of the one of the flash-memory cells to provide error-corrected data, the ECC decoder being an iterative low-density parity-check decoder; and
      a host interface configured to transfer the error-corrected data of the data storage device to a host device.

9. The data storage device of claim 8, wherein the soft information for the data value is represented by a particular number of bits, the particular number of bits being less than a number of the multiple reads of the one of the flash-memory cells.

10. The data storage device of claim 8, wherein the data link communicates in accordance with an Open NAND Flash Interface (ONFI) specification or a Toggle mode communication protocol.

11. The data storage device of claim 8, wherein the soft information represents a hard-decision and reliability information for the data value stored by the one of the flash-memory cells.

12. The data storage device of claim 8, wherein the data storage device is embodied as a solid-state hard drive, a universal serial bus (USB) storage drive, a peripheral component interconnect express (PCI-express)-based memory module, or as part of a printed circuit assembly of an electronic device.

13. The data storage device of claim 8, wherein the array of the flash-memory cells is an array of single-level-cell (SLC) flash-memory cells configured to store a single bit of data value per cell or an array multi-level-cell (MLC) flash-memory cells configured to store two of more bits of data value per cell.

14. The data storage device of claim 8, wherein the flash-memory IC includes a data buffer configured to store each of the data bits produced by one of the multiple reads of the flash-memory cells.

15. A method comprising:
reading, from a flash-memory cell of a flash-memory integrated circuit (IC), a data bit representing a data value stored by the flash-memory cell;
determining, within the flash-memory IC, soft information for the data value based on the data bit read from the flash-memory cell and at least one data bit previously read from the flash-memory cell; and
transferring, from the flash-memory IC and via a data link, the soft information for the data value to a flash-memory controller IC for iterative decoding of the data value, the data bit read from the flash-memory cell and the at least one data bit previously read from the flash-memory cell not transferred from the flash-memory IC via the data link.

16. The method of claim 15, wherein the data bit read from the flash-memory cell and the at least one data bit previously read from the flash-memory cell are read from the flash-memory IC by using different reference voltages.

17. The method of claim 15, wherein the data link is compliant with an Open NAND Flash Interface (ONFI) specification or a Toggle mode communication protocol.

18. The method of claim 15 further comprising, prior to transferring the soft information from the flash-memory IC, writing the soft information to a data buffer within the flash-memory IC.

19. The method of claim 15, wherein the flash-memory cell is a single-level-cell (SLC) flash-memory cell configured to store a single bit of data or a multi-level-cell (MLC) flash-memory cell configured to store two of more bits of data value.

20. The method of claim 15, wherein the soft information represents a hard-decision and reliability information for the data value stored by the flash-memory cell.

\* \* \* \* \*